(12) United States Patent
Igarashi et al.

(10) Patent No.: US 11,527,494 B2
(45) Date of Patent: Dec. 13, 2022

(54) MODULE AND ELECTRONIC APPARATUS

(71) Applicant: SONY SEMICONDUCTOR SOLUTIONS CORPORATION, Kanagawa (JP)

(72) Inventors: Takahiro Igarashi, Kanagawa (JP); Shusaku Yanagawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 41 days.

(21) Appl. No.: 17/055,649

(22) PCT Filed: Apr. 10, 2019

(86) PCT No.: PCT/JP2019/015556
§ 371 (c)(1),
(2) Date: Nov. 16, 2020

(87) PCT Pub. No.: WO2019/220821
PCT Pub. Date: Nov. 21, 2019

(65) Prior Publication Data
US 2021/0233876 A1 Jul. 29, 2021

(30) Foreign Application Priority Data

May 17, 2018 (JP) .............................. JP2018-095115

(51) Int. Cl.
*H01Q 1/24* (2006.01)
*H01L 23/66* (2006.01)
*H01L 23/552* (2006.01)
*H01L 23/00* (2006.01)
(Continued)

(52) U.S. Cl.
CPC ............ *H01L 23/66* (2013.01); *H01L 23/552* (2013.01); *H01L 24/32* (2013.01); *H01Q 1/2283* (2013.01); *H01Q 1/243* (2013.01); *H01Q 21/065* (2013.01); *H01L 2223/6677* (2013.01); *H01L 2224/32265* (2013.01)

(58) Field of Classification Search
CPC ..... H01Q 1/2283; H01Q 1/243; H01Q 21/065
See application file for complete search history.

(56) References Cited

U.S. PATENT DOCUMENTS

2003/0103006 A1* 6/2003 Yamada .................. H01L 23/66
343/700 MS
2007/0057848 A1* 3/2007 Maniwa ............... H01Q 1/1271
343/700 MS

FOREIGN PATENT DOCUMENTS

| CN | 1933238 A | 3/2007 |
|---|---|---|
| EP | 1304766 A1 | 4/2003 |
| EP | 1764859 A1 | 3/2007 |

(Continued)

OTHER PUBLICATIONS

International Search Report and Written Opinion of PCT Application No. PCT/JP2019/015556, dated Jun. 25, 2019, 10 pages of ISRWO.

*Primary Examiner* — Graham P Smith
(74) *Attorney, Agent, or Firm* — Chip Law Group

(57) ABSTRACT

A module of an embodiment of the present disclosure includes a first substrate including a first wiring pattern and a second substrate having a second wiring pattern with a wiring density different from that of the first wiring pattern, in which the second substrate is bonded to the first substrate. At least one of the first substrate or the second substrate has visible light transmittance.

12 Claims, 7 Drawing Sheets

(51) Int. Cl.
*H01Q 1/22* (2006.01)
*H01Q 21/06* (2006.01)

(56) References Cited

FOREIGN PATENT DOCUMENTS

| | | |
|---|---|---|
| JP | 2003-017909 A | 1/2003 |
| JP | 2007-081554 A | 3/2007 |
| JP | 2007-173759 A | 7/2007 |
| JP | 2014-165529 A | 9/2014 |
| JP | 2018-095115 A | 6/2018 |
| KR | 10-2007-0030108 A | 3/2007 |
| TW | 200713690 A | 4/2007 |
| WO | 2002/003499 A1 | 1/2002 |

* cited by examiner

MODULE AND ELECTRONIC APPARATUS

CROSS REFERENCE TO RELATED APPLICATIONS

This application is a U.S. National Phase of International Patent Application No. PCT/JP2019/015556 filed on Apr. 10, 2019, which claims priority benefit of Japanese Patent Application No. JP 2018-095115 filed in the Japan Patent Office on May 17, 2018. Each of the above-referenced applications is hereby incorporated herein by reference in its entirety.

TECHNICAL FIELD

The present disclosure relates to a module for submillimeter waves and millimeter waves, for example, and an electronic apparatus equipped with the module.

BACKGROUND ART

In recent years, information quantity has been increasing in mobile communications. To deal with this current situation, the fifth-generation mobile communication system (5G) is proposed that uses electric waves in a millimeter wave range. A module (communication module) used for mobile communications includes various types of integrated circuits (ICs) mounted thereon, such as a power amplifier (PA), a low noise amplifier (LNA), and an RF-switch. To further mount an element for dealing with attenuation characteristics of the millimeter waves and to incorporate an antenna, ingenuities for size reduction are desired for the 5G-compatible communication module compared to the communication module of the fourth generation mobile communication system (4G)/LTE or earlier.

As a measure against this, for example, PTL 1 discloses a high-frequency circuit substrate including two substrates (a first high-frequency circuit substrate and a second high-frequency circuit substrate) with different functions bonded together by resin or the like. The high-frequency circuit substrate includes the first high-frequency circuit substrate and the second high-frequency circuit substrate that are laminated, the first high-frequency circuit substrate including a first dielectric layer, a first conductor layer, a second dielectric layer, and a second conductor layer laminated in this order and the second high-frequency circuit substrate including a third dielectric layer, a third conductor layer, a fourth dielectric layer, and a fourth conductor layer laminated in this order, in which high frequency transmission lines provided on the second electrically conductive layer and the fourth electrically conductive layer are coupled by electromagnetic field coupling via slots provided in the first conductor layer and the third conductor layer, respectively.

CITATION LIST

Patent Literature

PTL 1: Japanese Unexamined Patent Application Publication No. 2003-17909

SUMMARY OF THE INVENTION

Incidentally, in the communication module including two substrates bonded together as described above, wiring patterns and wiring densities formed on the substrates are significantly different between the substrates. Thus, the substrates have different degrees of warpage, leading to a concern about decreased reliability due to degradation of signal quality or the like as a result of failure of correction of the warpage even when the two substrates are bonded.

It is desirable to provide a module and an electronic apparatus allowing for both size reduction and reliability.

A module of an embodiment of the present disclosure includes a first substrate having a first wiring pattern and a second substrate having a second wiring pattern with a wiring density different from that of the first wiring pattern, in which the second substrate is bonded to the first substrate. At least one of the first substrate or the second substrate has visible light transmittance.

An electronic apparatus of an embodiment of the present disclosure includes, as a module, the module according to the above-described embodiment.

In the module of an embodiment of the present disclosure and the electronic apparatus of an embodiment, a substrate having the visible light transmittance is used for at least one of the first substrate or the second substrate respectively having the first wiring pattern and the second wiring pattern with mutually different wiring densities, and the first substrate and the second substrate are bonded together. This makes it possible to correct substrate warpage of the first substrate and the second substrate.

According to the module of an embodiment of the present disclosure and the electronic apparatus of an embodiment, at least one of the first substrate or the second substrate having wiring patterns with mutually different wiring densities is the substrate having the light transmittance and the substrates are bonded together, thus correcting warpage of the first substrate and the second substrate. This makes it possible to achieve both size reduction and reliability.

It is to be noted that effects of the present disclosure are not necessarily limited, and may be any of the effects described in the present specification.

MODES FOR CARRYING OUT THE INVENTION

In the following, embodiments of the present disclosure are described in detail with reference to the drawings. The following description is merely a specific example of the present disclosure, and the present disclosure is not to be limited to the following embodiments. Moreover, the present disclosure is not limited to an arrangement, a dimension, a dimensional ratio, and the like of each element illustrated in each drawing. It is to be noted that description is given in the following order.

1. Embodiment (Example of Module Using Glass Substrate)
    1-1. Configuration of Module
    1-2. Method of Manufacturing Module
    1-3. Workings and Effects
2. Modification Example 1 (Example of Providing Three-Layered Anti-Interference Film between First Substrate and Second Substrate)
3. Modification Example 2 (Example of Using Si Substrate as Second Substrate)
4. Application Example

1. Embodiment

Figure 1:
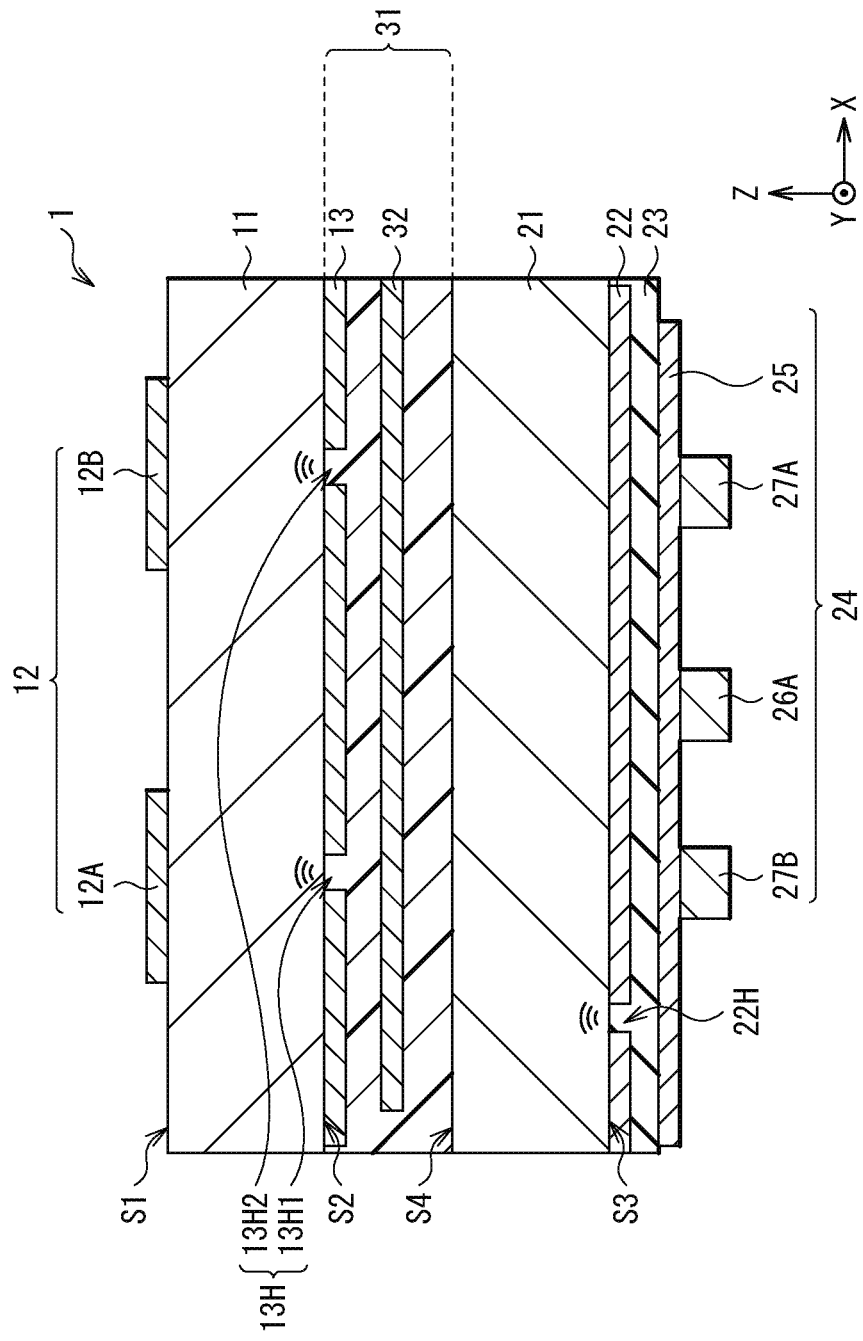
FIG. 1 is a cross-sectional view of a configuration of a module according to an embodiment of the present disclosure.
Figure 2:
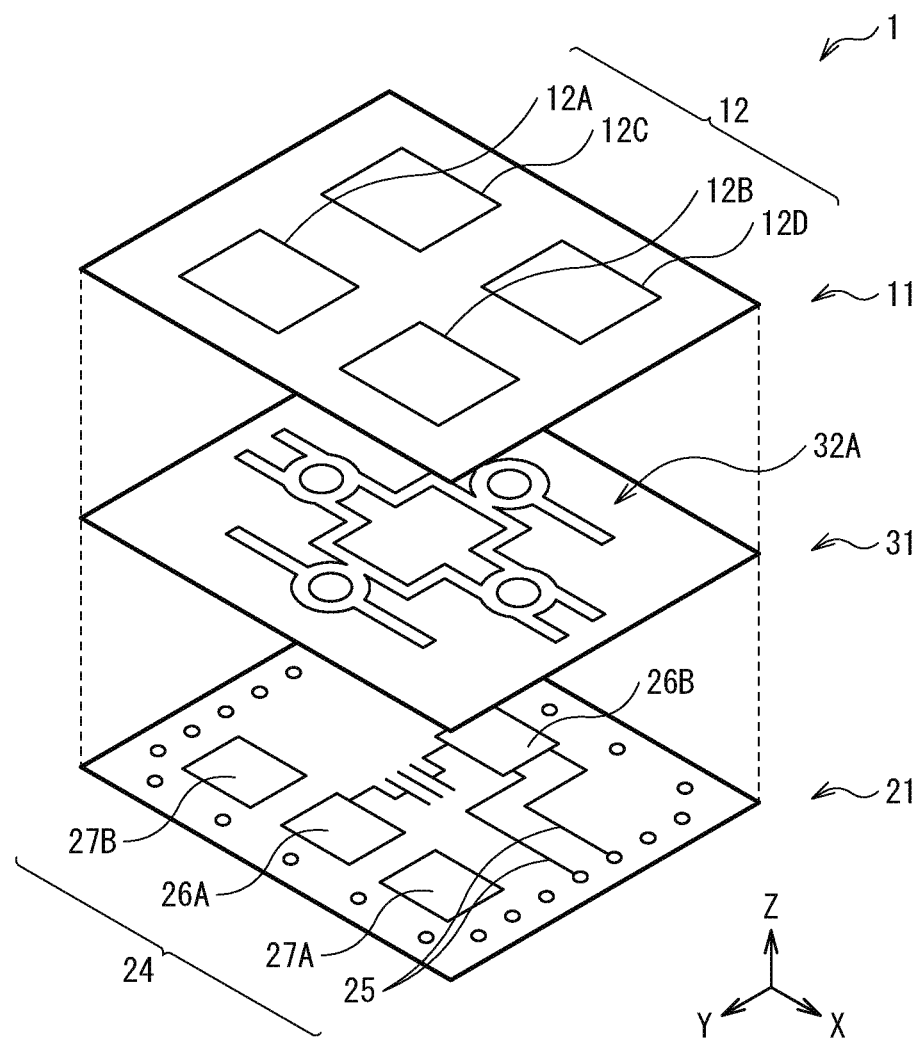
FIG. 2 is an exploded perspective view of the configuration of the module illustrated in FIG. 1.

FIG. 1 illustrates a cross-sectional configuration of a module (module 1) according to an embodiment of the present disclosure. FIG. 2 is an exploded perspective view of the module 1 illustrated in FIG. 1. This module 1 is used as a communication module in mobile communications that use electric waves in a submillimeter wave range and a millimeter wave range, for example. The module 1 includes a first substrate 11 having an opposing pair of a surface S1 and a surface S2 and a second substrate 21 having an opposing pair of a surface S3 and a surface S4, the first substrate 11 and the second substrate 21 being bonded together with the surface S2 and the surface S4 facing each other via a resin layer 31. The module 1 according to the present embodiment has a configuration in which a substrate is used that includes, for example, wiring patterns (an antenna 12 and a high frequency circuit 24) with different wiring densities on the surface S1 of the first substrate 11 and the surface S2 of the second substrate 21, respectively, and in which the substrate having visible light transmittance is used as each of the first substrate 11 and the second substrate 21.

(1-1. Configuration of Module)

The module 1 includes, as described above, the first substrate 11 and the second substrate 21 having the visible light transmittance and having the wiring patterns with mutually different densities, the first substrate 11 and the second substrate 21 being laminated via the resin layer 31.

It is preferable that each of the first substrate 11 and the second substrate 21 have the visible light transmittance and high shape stability. Specifically, it is preferable that the first substrate 11 and the second substrate 21 have coefficients of linear expansion no less than $30 \times 10^{-7}/C$ and no more than $100 \times 10^{-7}/C$. Examples of the substrate include a glass substrate and an alkali-free glass substrate including silicon (Si), oxygen (O), and a metallic element.

Provided on the first substrate 11 and the second substrate 21 are the wiring patterns with mutually different wiring densities. For example, the first substrate 11 includes the surface S1 and the surface S2 opposite from each other and, as illustrated in FIG. 2, for example, four antennas 12A, 12B, 12C, and 12D are provided on the surface S1. Provided on the surface S2 is a ground (GND) 13, forming a ground surface. Openings 13H1 and 13H2 serving as slots are provided at positions corresponding to the antennas 12A and 12B, for example, of the GND 13. It is to be noted that, although not illustrated in FIG. 1, the antennas 12C and 12D are preferably provided with respective openings serving as slots on the GND 13 surface as well. A film thickness (in the following, simply referred to as thickness) in a lamination direction (Z-axis direction in FIG. 1) of the first substrate 11 is preferably 0.4 mm or less, for example, and desirably about 0.3 mm, for example, in view of strength and the thickness of the module 1.

The second substrate 21 includes the surface S3 and the surface S4 opposite from each other and, for example, a GND 22 is provided on the surface S3. The GND 22 is provided with an opening 22H serving as the slot, as with the GND 13. On the GND 22, a high frequency circuit 24 is provided further via an insulating layer 23. The high frequency circuit 24 includes, for example, a transmission line 25, an RF switch 26 (26A, 26B), a power amplifier (PA) 27A, and a low noise amplifier (LNA) 27B. The thickness of the second substrate 21 is preferably 0.4 mm or less, for example, and desirably about 0.3 mm, for example, in view of strength and the thickness of the module 1.

The resin layer 31 preferably includes a material having the visible light transmittance. Examples of the material include, for example, acrylic resin, polyimide resin, epoxy resin, and the like. The resin layer 31 is provided with, for example, a butler matrix 32A, as illustrated in FIG. 2, as a component for antenna steering, for example.

The first substrate 11 and the second substrate 21 are bonded together with the surface S2 and the surface S4 facing each other via the resin layer 31.

In the module 1 of the present embodiment, signal transmission between the first substrate 11 and the second substrate 21 is performed using electromagnetic coupling. For example, a signal flowing from 24 is transferred to a conductive film 32 via the opening 22H by electromagnetic coupling, and further to the antennas 12A and 12B via the respective slots (openings 13H1 and 13H2) provided in the GND 13.

(1-2. Method of Manufacturing Module)

Next, an example of a method of manufacturing the module 1 is described. First, a metal film is formed on the surface S1 of the first substrate by plating, for example. Subsequently, the metal film is patterned by a lithographic technique and a wet process, thereby forming the four antennas 12A, 12B, 12C, and 12D, for example. Next, the metal film is formed on the surface S2 of the first substrate 11 by plating, for example. Subsequently, the metal film is patterned by the lithographic technique and the wet process. In this manner, the GND 13 having the openings 13H1 and 13H2 is formed.

Next, the metal film is formed on the surface S3 of the second substrate 21 by plating, for example. Subsequently, the metal film is patterned by the lithographic technique and the wet process, thereby forming the GND 22 having the opening 22H. Subsequently, after forming the insulating layer 23 by sputtering, for example, the metal film is formed on the insulating layer 23 by plating, for example. Next, the metal film is patterned by the lithographic technique and the wet process, thereby forming the transmission line 25. Subsequently, the RF switches 26A and 26B, the PA 27A, and the LNA 27B are arranged where appropriate. In this manner, the high frequency circuit 24 is formed on the insulating layer 23.

Next, after forming a resin film as a portion of the resin layer 31 on the surface S2 of the first substrate 11, the metal film is formed on the resin film by plating, for example. Subsequently, the metal film is patterned by the lithographic technique and the wet process, thereby forming the butler matrix 32A. Next, resin is applied again on the resin film including the butler matrix 32A, which is bonded facing the surface S4 of the second substrate 21. In this manner, the module 1 illustrated in FIG. 1 is completed.

Figure 3:
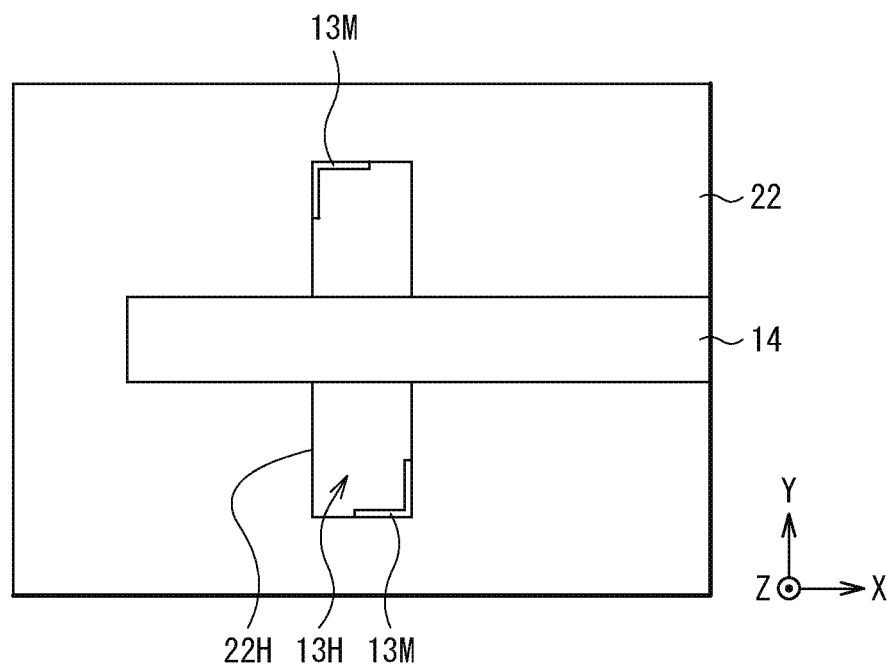
FIG. 3 is a schematic diagram for describing a method of aligning the module illustrated in FIG. 1.

It is to be noted that the opening 13H of the GND 13 provided to the first substrate 11 preferably includes an alignment mark 13M, as illustrated in FIG. 3, for example. The alignment mark 13M may be provided as a protrusion that is a portion of the metal film included in the GND 13, for example. This makes it possible to easily and precisely perform alignment, when bonding the first substrate 11 and the second substrate 21 together, for example, among the signal line 25A formed as a portion of the transmission line 25 on the surface S3 of the second substrate 21, the opening 22H provided in the GND 22, and the opening 13H provided in the GND 13 on the surface S2 of the first substrate 11.

(1-3. Workings and Effects)

As described above, in recent years, information quantity has been increasing in mobile communications, and the 5G is proposed that uses electric waves in a millimeter wave range to deal with this current situation. A 5G-compatible communication module further includes an element mounted thereon for dealing with attenuation characteristics of the millimeter waves besides various types of integrated circuits (ICs) mounted thereon, such as a power amplifier (PA), a low noise amplifier (LNA), and an RF-switch, or incorporates an antenna. Therefore, ingenuities for size reduction are desired for the 5G-compatible communication module compared to the communication module of the 4G/LTE or older technologies.

Figure 4:
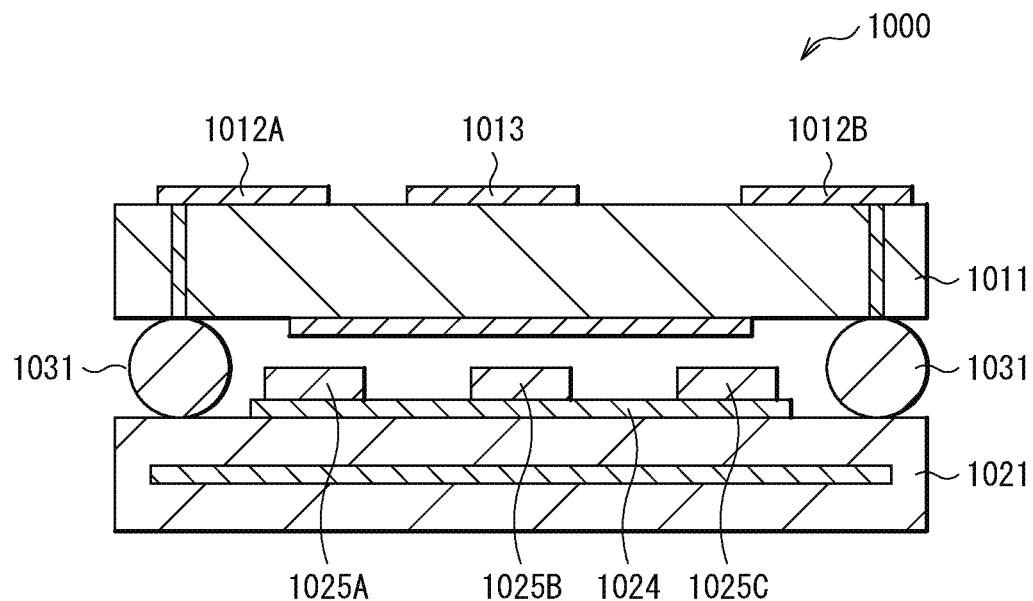
FIG. 4 is a cross-sectional view of an example of a configuration of a typical module.

One ingenuity for size reduction may be, as with a module 1000 illustrated in FIG. 4, for example, a structure including two substrates 1011 and 1021 with different functions laminated using solder 1031. This module 1000 allows for size reduction by lamination, but also causes loss, reflection, and radiation due to mismatch of impedance at the solder 1031. Moreover, the module illustrated in FIG. 4 includes antennas 1012A and 1012B and a wiring pattern 1013 provided on one surface of the substrate 1011 and includes a wiring pattern 1024 and various types of chip components 1025A, 1025B, and 1025C provided on one surface of the substrate 1021, in which the substrate 1011 and the substrate 1021 have different wiring densities. In a case where the substrates 1011 and 1021 use members having a high coefficient of linear expansion, bonding by the solder 1031 brings about a concern about decreased reliability due to lack of bonding strength.

Figure 5:
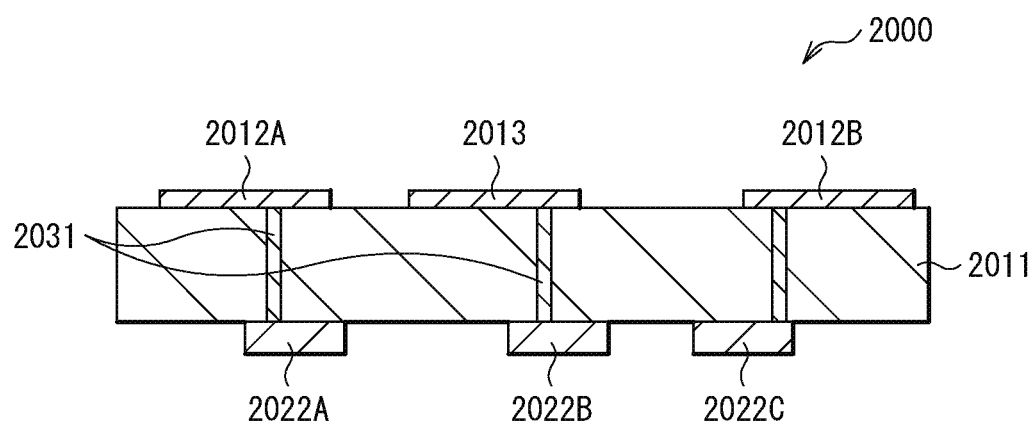
FIG. 5 is a cross-sectional view of another example of the configuration of the typical module.

Another ingenuity for size reduction may be, as with a module 2000 illustrated in FIG. 5, for example, a method of electrically coupling, for example, antennas 2012A and 2012B and a wiring pattern 2013 provided on a front surface of the substrate 2011 and a plurality of chip components 2022A, 2022B, and 2022C provided on a rear surface of the substrate 2011 using respective through electrodes 2031. However, the coupling that uses the through electrodes 2031 brings about a concern that attenuations and interferences have a large influence in the millimeter wave range.

Furthermore, as described above, although there is a method of bonding two substrates with different functions together using resin or the like, in an RF module, a topmost surface is an antenna surface and other surfaces include components, ICs, and the like mounted thereon, the components and the ICs being configured by transmission lines, with wiring patterns and wiring densities significantly different from those of the antenna surface. Thus, the substrates have different degrees of warpage, leading to a possibility of insufficient correction of the warpage caused by bonding and its consequential decrease in reliability due to, for example, deterioration in signal quality. In particular, a substrate having a high coefficient of linear expansion or a substrate containing a filler may have an anisotropy in the linear expansion, which is susceptible to an influence significantly, in particular.

In contrast, in the present embodiment, the first substrate 11 and the second substrate 21 include the substrates having the visible light transmittance, the first substrate 11 including the antenna 12 and the GND 13 respectively on the surface S1 and the surface S2 opposite from each other and the second substrate 21 including the GND 22 and the high frequency circuit 24 on the surface S3 out of the surface S3 and the surface S4 opposite from each other, and the first substrate 11 and the second substrate are bonded together via the resin layer 31. Examples of the substrate having the visible light transmittance include, for example, a glass substrate. The glass substrate has a low coefficient of linear expansion, high shape stability, and high thermal stability. This makes it possible to correct substrate warpage of the first substrate 11 and the second substrate 21 having different warping widths.

As described above, in the module 1 of the present embodiment, the first substrate 11 and the second substrate 21 having the wiring patterns with mutually different wiring densities include, for example, the glass substrates having the visible light transmittance, and are bonded together via the resin layer 31. This makes it possible to correct warpage of the first substrate 11 and the second substrate 21 having different warping widths due to different wiring densities. Thus, it is possible to improve reliability while reducing the size.

Moreover, in the present embodiment, the electromagnetic coupling is used for signal transmission between the antenna 12 and the high frequency circuit 24 respectively provided on the surface S1 of the first substrate 11 and the surface S3 of the second substrate 21. Using the electromagnetic coupling typically demands an alignment accuracy between top and bottom substrates. In contrast, the present embodiment uses the substrates having the visible light transmittance, namely transparent substrates as the first substrate 11 and the second substrate 21, thereby making it possible to easily and precisely perform alignment at the time of bonding by providing the alignment mark (for example, the alignment mark 13M) to each of the opening 22H, the openings 13H1 and 13H2, and the like serving as the slots. Thus, it is possible to further improve reliability.

Next, modification examples (modification examples 1 and 2) of the present disclosure are described. In the following, components similar to those in the above-described embodiment are denoted with the same reference numerals, and description thereof is omitted where appropriate.

2. Modification Example 1

Figure 6:
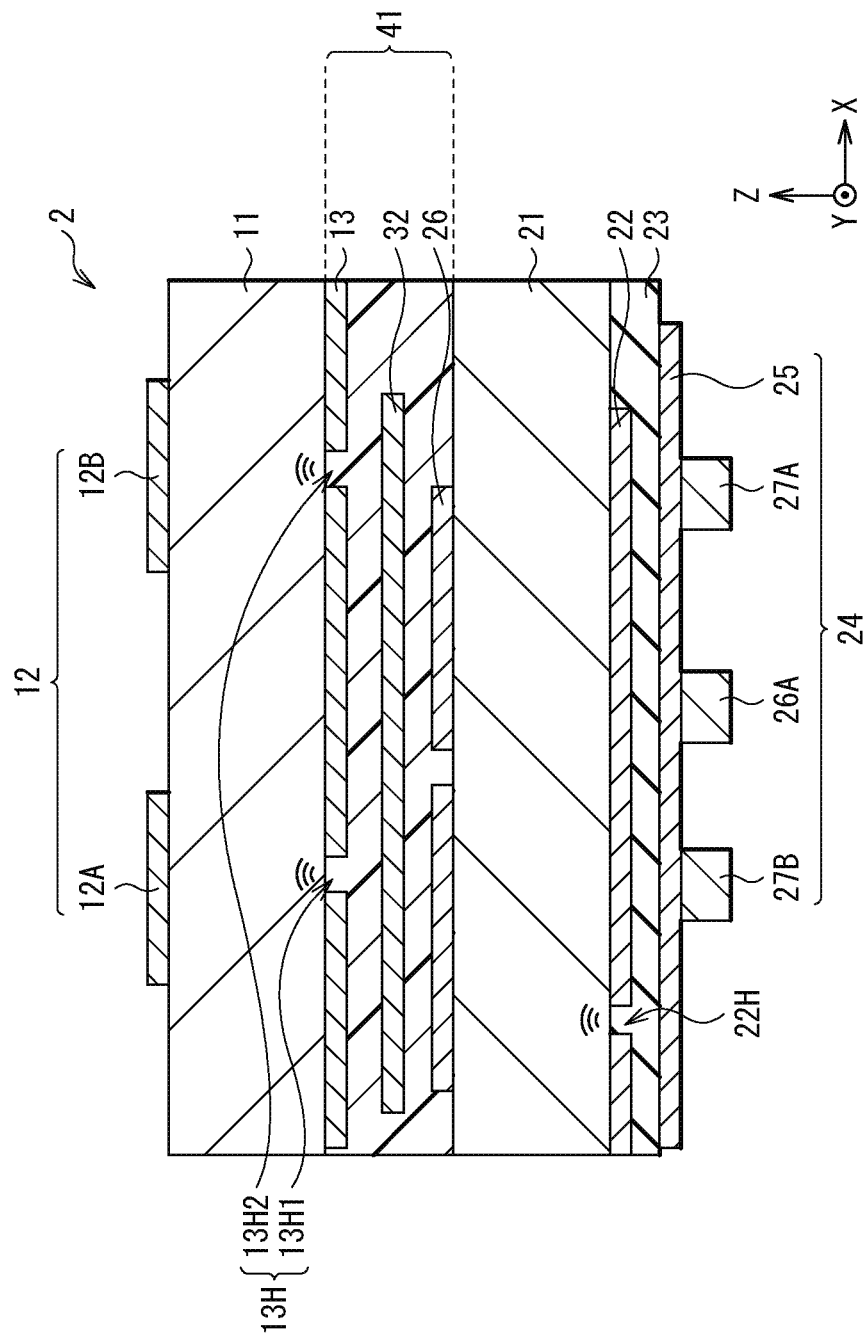
FIG. 6 is a cross-sectional view of a configuration of a module according to a modification example 1 of the present disclosure.

FIG. 6 illustrates a cross-sectional configuration of a module (module 2) according to a modification example 1 of the present disclosure. As with the module 1 in the above-described embodiment, this module 2 is used as a communication module in mobile communications that use electric waves in a submillimeter wave range and a millimeter wave range, for example. The module 2 includes the first substrate 11 having the opposing pair of the surface S1 and the surface S2 and the second substrate 21 having the opposing pair of the surface S3 and the surface S4, the first substrate 11 and the second substrate 21 being bonded together with the surface S2 and the surface S4 facing each other via the resin layer 31. The module 2 of the present modification example is different from the above-described embodiment in that, for example, a conductive film 26 is further added between the surface S2 of the first substrate 11 and the surface S4 of the second substrate facing each other, thereby providing an anti-interference film 41, for example.

The module 2 includes the anti-interference film 41 between the first substrate 11 and the second substrate 21 facing each other as described above. The anti-interference film 41 includes three metal films; for example, the GND 13 provided on the surface S2 of the first substrate 11, the conductive film 32 provided in the resin layer 31, and the conductive film 26 provided on the surface S4 of the second substrate 21.

In this manner, in the present modification example, it is possible to add a conductive film, where appropriate, between the first substrate 11 and the second substrate 21 bonded by the resin layer 31, making it possible to provide the three-layered anti-interference film 41, for example. This makes it possible to prevent interference between the first substrate 11 and the second substrate 21, thereby providing the module 2 with higher signal quality.

It is to be noted that, although an example of the anti-interference film 41 provided between the first substrate 11 and the second substrate 21 is described in the present modification example, the present disclosure is not limited thereto. For example, it is possible to provide a matching circuit and the like.

3. Modification Example 2

Figure 7:
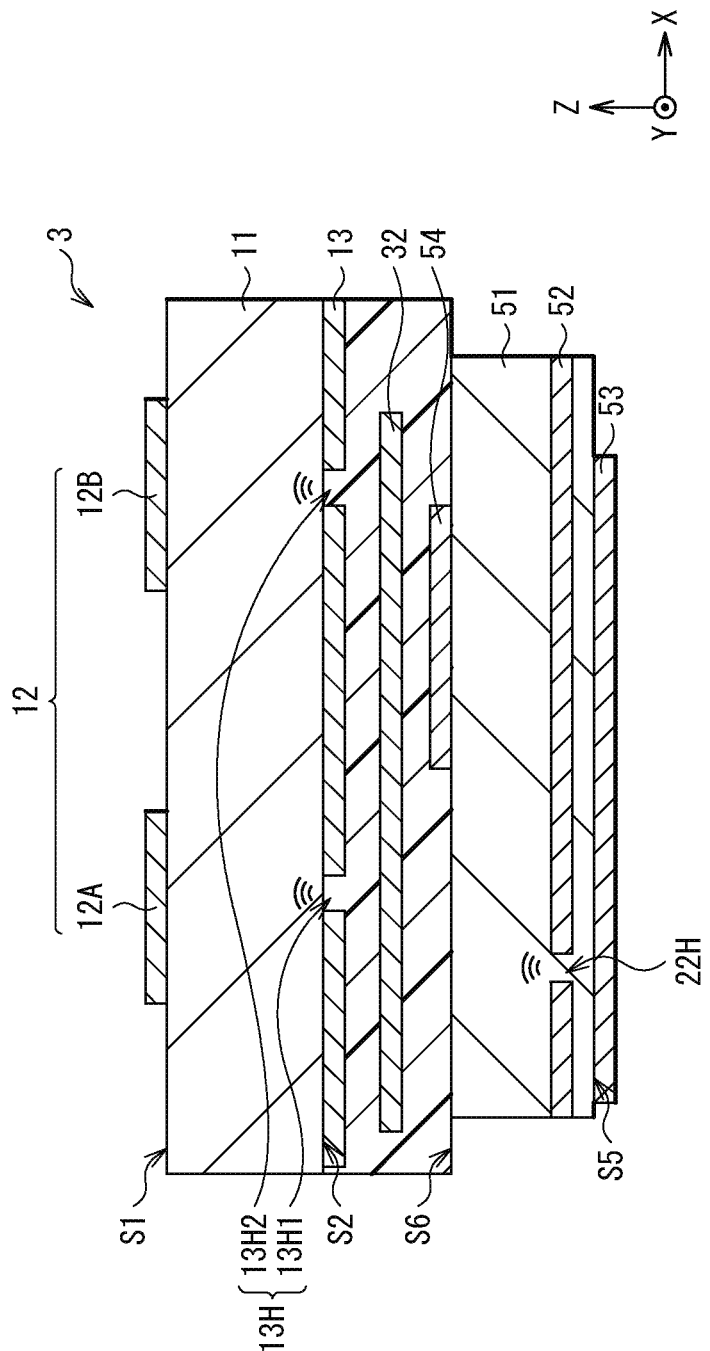
FIG. 7 is a cross-sectional view of a configuration of a module according to a modification example 2 of the present disclosure.

FIG. 7 illustrates a cross-sectional configuration of a module (module 3) according to a modification example 2 of the present disclosure. As with the module 1 in the above-described embodiment, this module 3 is used as a communication module in mobile communications that use electric waves in a submillimeter wave range and a millimeter wave range, for example. The module 3 includes the first substrate 11 having the opposing pair of the surface S1 and the surface S2 and a second substrate 51 having the opposing pair of a surface S5 and a surface S6, the first substrate 11 and the second substrate 51 being bonded together with the surface S2 and the surface S6 facing each other via the resin layer 31. The module 3 of the present modification example is different from the above-described embodiment and the modification example 1 in that, for example, the second substrate 51 includes a silicon (Si) substrate.

Although examples of using the substrates having the visible light transmittance for both the first substrate 11 and the second substrate 21 are described in the above-described embodiment and the modification example 1, the present disclosure is not limited thereto, and at least one of them may have the visible light transmittance. In that case, it is preferable to use a substrate with a difference in a coefficient of linear expansion from that of the substrate having the visible light transmittance being no less than −2 and no more than +6, for example. Examples of the substrate include, for example, an Si substrate, low-temperature sintered ceramic, and the like.

In this manner, there is an effect of achieving size reduction by using an Si substrate, for example, as one of the first substrate 11 and the second substrate 51 to be bonded together by the resin layer 31 (in this case, the second substrate 51).

It is to be noted that, in a case of using a substrate having no visible light transmittance as the second substrate 51 as in the present modification example, for bonding the first substrate 11 and the second substrate 51 together, for example, the substrate is processed into a size that matches a shape of a GND 52 provided on the second substrate 51 and aligned to an outer shape of the second substrate 51. This makes it possible to easily and precisely perform alignment at the time of bonding. Thus, it is possible to further improve reliability.

4. Application Example

Next, an application example of the module 1 (and modules 2 and 3) described in the above-described embodiment and the modification examples 1 and 2 is described. Note that a configuration of an electronic apparatus described below is merely an example and the configuration may be modified where appropriate. The above-described module 1 (and the modules 2 and 3) may be applied to a portion of each type of the electronic apparatus, and the type of the electronic apparatus is not specifically limited.

Figure 8:
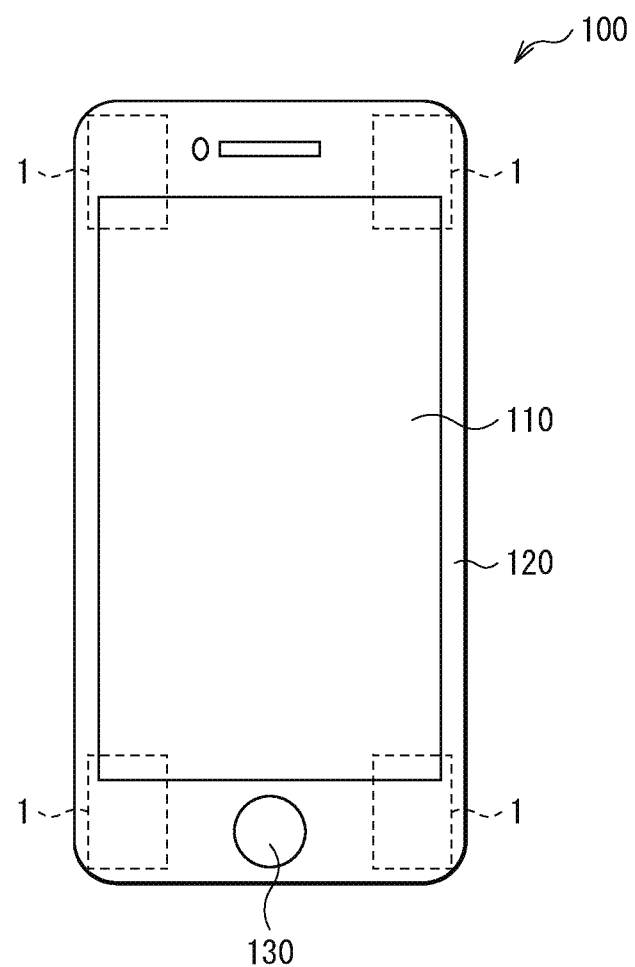
FIG. 8 is a schematic diagram illustrating a mobile apparatus including a module as an application example of the present disclosure.

FIG. 8 illustrates an appearance of a mobile apparatus 100. The mobile apparatus 100 includes, for example, a display section 110 and a non-display section 120, and an operation section 130. It is to be noted that the operation section 130 may be provided on a front surface of the non-display section 120 as illustrated in FIG. 8, or may be provided on a top surface. The module 1 (and the modules 2 and 3) is preferably arranged in each of four corners of the front surface that are less likely to be hidden by a hand during operation as illustrated in FIG. 8, for example. It is to be noted that the module 1 (and the modules 2 and 3) may be mounted on a PDA (Personal Digital Assistants), an electronic book, a tablet personal computer, or the like having a configuration similar to that of the mobile apparatus 100 illustrated in FIG. 8.

Although the present technology has been described above with reference to the embodiment and the modification examples, the present disclosure is not limited to the above-described embodiment or the like but various alterations are possible.

It is to be noted that effects described herein are merely exemplary and are not limitative, and there may be other effects.

Moreover, the present disclosure may have the following configurations.

(1)
A module including:
a first substrate including a first wiring pattern; and
a second substrate including a second wiring pattern with a wiring density different from that of the first wiring pattern, the second substrate being bonded to the first substrate, in which
at least one of the first substrate or the second substrate has visible light transmittance.

(2)
The module according to (1), in which at least one of the first substrate or the second substrate includes a glass substrate including silicon (Si), oxygen (O), and a metallic element.

(3)
The module according to (1) or (2), in which the first substrate and the second substrate are bonded together via a resin layer.

(4)
The module according to (3), in which
the first wiring pattern is provided on one surface of the first substrate,
the second wiring pattern is provided on one surface of the second substrate, and the first substrate and the second substrate are bonded together with their respective other surfaces opposite from the respective one surfaces facing each other via the resin layer.

(5)

The module according to (4), in which the first wiring pattern includes an antenna pattern and the second wiring pattern includes a high frequency circuit.

(6)

The module according to (5), in which the first substrate includes a third wiring pattern provided on the other surface, the third wiring pattern forming a ground surface.

(7)

The module according to (6), in which the resin layer is provided between the first substrate and the second substrate, and a conductive film is provided inside the resin layer.

(8)

The module according to (7), in which
the second substrate includes a fourth wiring pattern on the other surface, and
an anti-interference film is provided between the first substrate and the second substrate, the anti-interference film including the third wiring pattern, the conductive film, and the third wiring pattern.

(9)

The module according to any one of (6) to (8), in which
the first substrate has an opening that penetrates through the third wiring pattern, and
the first wiring pattern and the second wiring pattern are electromagnetically coupled through the first substrate and the second substrate.

(10)

The module according to any one of (1) to (9), in which the substrate having the visible light transmittance has a coefficient of linear expansion no less than $30\times10^{-7}$/C and no more than $100\times10^{-7}$/C.

The module according to any one of (1) to (10), in which a difference in a coefficient of linear expansion between the first substrate and the second substrate is no less than −2 and no more than +6.

(12)

The module according to any one of (5) to (11), in which the second substrate includes a silicon substrate, and includes, as the high frequency circuit, a power amplifier, a low noise amplifier, and a matching circuit.

(13)

An electronic apparatus with a module, the module including:
a first substrate including a first wiring pattern; and
a second substrate including a second wiring pattern with a wiring density different from that of the first wiring pattern, the second substrate being bonded to the first substrate, in which
at least one of the first substrate or the second substrate has visible light transmittance.

This application claims the benefit of Japanese Priority Patent Application JP2018-095115 filed with the Japan Patent Office on May 17, 2018, the entire contents of which are incorporated herein by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A module, comprising:
a first substrate including a first wiring pattern;
a second substrate including a second wiring pattern, wherein
a wiring density of the second wiring pattern is different from a wiring density of the first wiring pattern,
the second substrate is bonded to the first substrate, and
at least one of the first substrate or the second substrate has visible light transmittance;
a resin layer between the first substrate and the second substrate; and
a first conductive film inside the resin layer.

2. The module according to claim 1, wherein the at least one of the first substrate or the second substrate comprises a glass substrate including silicon (Si), oxygen (O), and a metallic element.

3. The module according to claim 1, wherein the first substrate and the second substrate are bonded together via the resin layer.

4. The module according to claim 3, wherein
the first substrate includes a first surface and a second surface,
the first surface is opposite to the second surface,
the first wiring pattern is on the first surface of the first substrate,
the second substrate includes a third surface and a fourth surface,
the third surface is opposite to the fourth surface,
the second wiring pattern is on the third surface of the second substrate,
the second surface faces the fourth surface, and
the first substrate and the second substrate are bonded together with the second surface and the fourth surface via the resin layer.

5. The module according to claim 4, wherein
the first wiring pattern comprises an antenna pattern, and
the second wiring pattern comprises a high frequency circuit.

6. The module according to claim 5, wherein
the first substrate includes a third wiring pattern on the second surface, and
the third wiring pattern corresponds to a ground surface.

7. The module according to claim 6, further comprising:
a fourth wiring pattern on the fourth surface of the second substrate; and
an anti-interference film between the first substrate and the second substrate, wherein
the anti-interference film includes the third wiring pattern, the first conductive film, and a second conductive film, and
the second conductive film is on the fourth surface of the second substrate.

8. The module according to claim 6, wherein
the first substrate has an opening that penetrates through the third wiring pattern, and
the first wiring pattern and the second wiring pattern are electromagnetically coupled through the first substrate and the second substrate.

9. The module according to claim 1, wherein the at least one of the first substrate or the second substrate having the visible light transmittance has a coefficient of linear expansion greater than or equals to $30\times10^{-7}$/C and less than or equals to $100\times10^{-7}$/C.

10. The module according to claim 1, wherein a difference in a coefficient of linear expansion between the first substrate and the second substrate is between −2 and +6.

11. The module according to claim 5, wherein
the second substrate comprises a silicon substrate, and
the high frequency circuit includes a power amplifier, a low noise amplifier, and a matching circuit.

12. An electronic apparatus, comprising:
a module that includes:
- a first substrate including a first wiring pattern; and
- a second substrate including a second wiring pattern, wherein
  - a wiring density of the second wiring pattern is different from a wiring density of the first wiring pattern,
  - the second substrate is bonded to the first substrate, and
  - at least one of the first substrate or the second substrate has visible light transmittance;
- a resin layer between the first substrate and the second substrate; and
- a conductive film inside the resin layer.

* * * * *